United States Patent [19]
Konishi

[11] Patent Number: 5,844,273
[45] Date of Patent: Dec. 1, 1998

[54] VERTICAL SEMICONDUCTOR DEVICE AND METHOD OF MANUFACTURING THE SAME

[75] Inventor: Yoshinori Konishi, Nagano, Japan

[73] Assignee: Fuji Electric Co., Japan

[21] Appl. No.: 569,449

[22] Filed: Dec. 8, 1995

[30] Foreign Application Priority Data

Dec. 9, 1994 [JP] Japan .................................. 6-305768

[51] Int. Cl.$^6$ .................................................. H01L 29/76
[52] U.S. Cl. ........................... 257/331; 257/329; 257/263
[58] Field of Search .................................. 257/331, 329, 257/330, 263

[56] References Cited

U.S. PATENT DOCUMENTS 5,430,315 7/1995 Rumennik ................................ 257/331
5,558,313 9/1996 Hshieh et al. ........................... 257/331

OTHER PUBLICATIONS

"Comparison of Ultralow Specific On–Resistance UMOS-FET Structures: the ACCUFET, EXTFET, INVFET, and Conventional UMOSFET's" by Isengyou Syau et al., IEEE Transactions on Electron Devices, vol. 41, No. 5, May 1994.

*Primary Examiner*—Jerome Jackson
*Assistant Examiner*—Nathan K. Kelley
*Attorney, Agent, or Firm*—Rossi & Associates

[57] ABSTRACT

A vertical semiconductor device incorporates a semiconductor laminar structure including a semiconductor substrate of a first conductive type having a relatively high impurity concentration, a first semiconductor layer of the first conductive type laminated on the semiconductor substrate and having a relatively low impurity concentration, and a second semiconductor layer of the first conductive type laminated on the first semiconductor layer and having an even lower impurity concentration. A trench is formed in the semiconductor laminar structure to extend through the second semiconductor layer into the first semiconductor layer. A source region of the first conductive type is formed in a surface layer of the second semiconductor layer and the trench is filled with a gate electrode. A source electrode is formed on the source region and a drain electrode is formed on a rear surface of the semiconductor substrate.

1 Claim, 4 Drawing Sheets

VERTICAL SEMICONDUCTOR DEVICE AND METHOD OF MANUFACTURING THE SAME

FIELD OF THE INVENTION

The present invention relates to a vertical semiconductor device for a switch used in a power source of a disc drive device or electrical equipment for automobiles, wherein the semiconductor device has a high withstand voltage and low ON-state resistance so as to deal with a relatively large electric power.

BACKGROUND OF THE INVENTION

A source voltage of five volts has been widely used in conventional control systems, such as electrical equipment for automobiles and disk drive devices. The main source voltage for this purpose, however, is being lowered from 5V down to 3.3V. or further down to 1.5V, to meet with recent requirements for higher processing speed of computers and lower consumption of electric power. The reduced source voltage is also desirable to prolong the service life of a device using, as a battery, a charging type secondary cell which has been developed and widely used. With the source voltage thus reduced, any voltage drop of a semiconductor device used in the power source cannot be ignored, and the device is thus required to have lower ON-state resistance.

Referring to FIG. 5, there is shown in cross section a principal part of a power element (semiconductor device), so-called DMOSFET (double diffusion type metal-oxide film semiconductor field-effect transistor), which has been used in the above field, and known as having a low withstand voltage and low ON-state resistance so as to deal with a relatively large electric power. While this figure shows only a unit part of an active region of the device assigned to perform switching of an electric current, a multiplicity of structures of FIG. 5 are normally integrated in the actual semiconductor device. In addition to the active region as shown in FIG. 5, the semiconductor device includes a peripheral portion contributing to withstanding voltage. This voltage-withstanding portion is not shown in the figure nor described in detail since it is not related to the principle of the present invention. In FIG. 5, an $n^-$ epitaxial layer 3 containing a low concentration of donor-forming type impurities is laminated on an $n^+$ substrate 1 containing a high concentration of the same type of impurities, to form an epitaxial substrate. P base region 11 selectively containing acceptor-forming type impurities is formed in a surface layer of the epitaxial substrate, and n source region 4 is formed in a part of a surface layer of the p base region 11. Further, a gate electrode 6 made of polycrystalline silicon is formed through a gate oxide film 5 on the surface of the p base region 11 interposed between the n-source region 4 and the $n^-$ epitaxial layer 3, and an exposed surface area of the $n^-$ epitaxial layer 3. Further, a source electrode 8 is formed on the surfaces of the n-source region 4 and p base region 11 for contact with both regions, and a drain electrode 9 is formed on the rear surface of the $n^+$ substrate 1. As shown in FIG. 5, the source electrode 8 extends over the gate electrode 6 through an insulating film 7.

In operation of the DMOSFET constructed as described above, when a voltage is applied between the drain electrode 9 and the source electrode 8, and a positive signal equal to or greater than a predetermined level is applied to the gate electrode 6, a channel of an inversion layer appears at the surface layer of the p base region 11 right under the gate electrode 6, and electrons flow from the n source region 4 into the $n^-$ epitaxial layer 3 through the channel. The electrons then reach the $n^+$ substrate due to an electric field, whereby the source electrode 8 and drain electrode 9 are electrically connected to each other. That is, an electric current flows from the drain electrode 9 to the source electrode 8. If the signal is removed from the gate electrode 6, the channel disappears, and the source electrode 8 is disconnected from the drain electrode 9. The semiconductor device constructed as described above is generally called a vertical semiconductor device wherein the semiconductor substrate has electrodes on its opposite major surfaces, and an electric current flows in the direction of the thickness of the substrate. The device having this structure is suitably used as a power element because of a high efficiency with which the surfaces of the semiconductor substrate can be utilized, and an increased current capacity. When this vertical DMOSFET is required to withstand a high voltage applied thereto, the $n^-$ epitaxial layer 3 serving to ensure a high withstand voltage highly contributes to (is highly attributed to) the ON-state resistance generated in the device, but the channel resistance does not constitute a large proportion of the ON-state resistance. When the vertical DMOSFET is required to withstand a small voltage, on the other hand, the thickness of the $n^-$ epitaxial layer 3 can be reduced, resulting in an increased proportion of the channel resistance in the ON-state resistance.

As one method for reducing the channel resistance, there has been proposed a UMOSFET having a gate accommodated in a trench. Referring to FIG. 6, there is shown in cross section a principal part of the UMOSFET, which is different from the DMOSFET of FIG. 5 in that a trench 12 is formed in the surface layer of the $n^-$ epitaxial layer 3, through the p base region 11, and that the gate electrode 6 is embedded in the trench 12 through a gate oxide film 5. Reference numeral 7 denotes an insulating film. The UMOSFET operates in the same manner as the DMOSFET, namely, an electric current flows between the drain electrode 9 and the source electrode 8 upon application of a positive voltage signal to the gate electrode 6. This UMOSFET having the trench gate ensures an increased area (gate area) of the channel per unit area of the semiconductor device, and does not suffer from narrowing of the channel due to a junction type FET effect. Accordingly, the UMOSFET has a lower channel resistance than the DMOSFET of FIG. 5, and is actually used in many applications.

Recently, B. J. Baliga reported an accumulation type MOSFET, hereinafter called ACCUFET, having a trench gate that can further lower the channel resistance (IEEE TRANSACTION ON ELECTRON DEVICE LETTERS in 1992, Vol. 13, No. 8, page 427). Referring to FIG. 7 showing a principal part of the ACCUFET, an $n^-$ epitaxial layer 3 containing a low concentration of impurities is laminated on an $n^+$ substrate 1 containing a high concentration of the impurities, to form an epitaxial substrate, and an n source region 4 is formed in a surface layer of the epitaxial substrate. Trenches 12 are formed from the substrate surface through the n source area 4 and $n^-$ epitaxial layer 3, and gate electrode 6 formed of polycrystalline silicon is embedded in each of the trenches 12 through a gate oxide film 5. Further, a source electrode 8 is formed on the surface of the n source region 4, and a drain electrode 9 is formed on the rear surface of the $n^+$ substrate 1. As shown in FIG. 7, the source electrode 8 is formed over the gate electrode 6 through an insulating film 7. Typical parameters of an example of this semiconductor device are as follows: the specific resistance of the $n^+$ substrate 1 is 0.002 cm; the impurity concentration and thickness of the $n^-$ epitaxial layer 3 are $1\times10^{14}$ cm$^{-3}$ and 2.5 µm, respectively; the width and depth of the trench 12 are both 3 μm; the dose and thickness of the n source region 4 are $1.3\times10^{15}$ cm$^{-2}$ and 0.5 μm, respectively; and the thickness of the gate oxide film 5 is 70 nm. In operation of this ACCUFET, when a voltage is applied between the drain electrode 9 and the source electrode 8, and the gate electrode 6 is positively biased, an accumulation layer appears in a portion of the n$^-$ epitaxial layer 3 along the gate electrode 6, and electrons flow from the n source region 4 into the n$^-$ epitaxial layer 3 through the accumulation layer. Then, the electrons reach the n$^+$ substrate due to an electric field, and the drain electrode 9 and the source electrode 8 are electrically connected to each other. If the gate electrode 6 is negatively biased, on the other hand, the accumulation layer disappears, and a depletion layer spreads out, whereby the drain electrode 9 and source electrode 8 are disconnected from each other. Since this device uses the accumulation layer to form a channel, rather than the inversion layer, the mobility of carriers at the channel can be increased, and thus the channel resistance can be reduced. Further, this device is advantageously free from an effect of a parasitic diode, since there is no pn junction in a current path.

However, the ACCUFET as described above has the following problems:

1) The withstand voltage of the gate oxide film 5 formed in the trench 12 is lower than that (about 8 MV/cm) of a gate oxide film formed on an ordinary flat portion, since the surface of the oxide film 5 is formed by etching and includes corner portions. In the structure of the ACCUFET as shown in FIG. 7, a voltage applied between the source and drain electrodes is substantially applied to the gate oxide film located at the bottom of the trench, and the withstand voltage of the device cannot be higher than that of the gate oxide film. That is, the ACCUFET cannot exhibit high resistance to a voltage applied thereto.

2) When a negative voltage is applied to the gate voltage 6 to switch off the ACCUFET, the depletion layer spreads out at the channel region, and is connected with another depletion layer spreading from a gate electrode of the adjacent trench, so that the whole drift region is depleted, and a current flowing through the region is cut off. This means that a leak current occurs when a voltage is applied to the device while it is in the OFF state, unless the trenches are formed at a considerably small interval. If the distance between the adjacent trenches is small, on the other hand, the current passage is narrowed, resulting in an increased ON-state resistance.

SUMMARY OF THE INVENTION

In the light of the above problems, it is an object of the present invention to provide an accumulation type field-effect transistor which has a high withstand voltage and suffers from a reduced leakage current.

The above object may be accomplished according to the principle of the present invention, which provides a vertical semiconductor device comprising: a semiconductor laminar structure including a semiconductor substrate of a first conductive type having a first impurity concentration, a first semiconductor layer of the first conductive type laminated on the semiconductor substrate and having a second impurity concentration lower than the first impurity concentration, and a second semiconductor layer of the first conductive type laminated on the first semiconductor layer and having a third impurity concentration lower than the second impurity concentration, the semiconductor laminar structure having a trench extending from a surface thereof through the second semiconductor layer to reach the first semiconductor layer; a source region of the first conductive type formed in a surface layer of the second semiconductor layer and having a fourth impurity concentration higher than the third impurity concentration; a gate electrode filling the trench through a gate oxide film; an insulating film formed on the gate electrode; a source electrode formed on a surface of the source region of the first conductive type; and a drain electrode formed on a rear surface of the semiconductor substrate of the first conductive type.

In the semiconductor device constructed as described above according to the present invention, the trench extends from the surface of the semiconductor laminar structure into the first semiconductor layer through the second semiconductor layer. In this arrangement, the first semiconductor layer carries a part of the voltage applied between the source and drain electrodes, thereby reducing a voltage to be carried by the gate oxide film. This eventually leads to an improved withstand voltage of the device.

In one preferred form of the present invention, a region of a second conductive type is formed in a portion of the surface layer of the second semiconductor layer between adjacent two trenches. In this case, a depletion layer spreading from one of the trenches easily reaches another depletion layer spreading from the adjacent trench, due to the presence of the second conductive type region, whereby the second semiconductor layer can be depleted more completely, resulting in a reduced leak current.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENT

Figure 1:
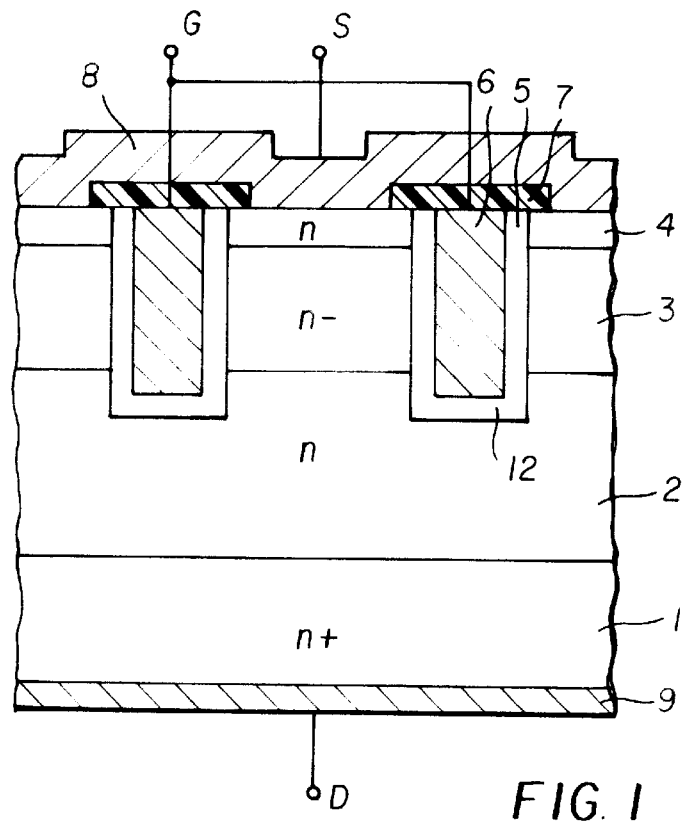
FIG. 1 is a cross sectional view showing a principal part of an ACCUFET (accumulation type field-effect transistor) according to the first embodiment of the present invention.

Referring to FIG. 1 showing in cross section a principal part of an ACCUFET (accumulation type field-effect transistor) as the first embodiment of the present invention, an n epitaxial layer 2 having an impurity concentration of $5\times10^{15}$ cm$^{-3}$ and a thickness of 6.0 μm is laminated on an n$^+$ substrate 1 having a specific resistance of 0.002 cm and a thickness of 300 μm, and an n$^-$ epitaxial layer 3 having a lower impurity concentration than the n epitaxial layer 2, i.e., $1\times10^{14}$ cm$^{-3}$, and a thickness of 4.5 μm is laminated on the n epitaxial layer 2, to form an epitaxial substrate. Further, an n source region 4 having an impurity concentration of $1\times10^{20}$ cm$^{-3}$ and a thickness of 0.2 μm is formed in a surface layer of the epitaxial substrate. Trenches 12 having a width of 1.8 μm and a depth of 5.5 μm are formed through the n source region 4 and the n$^-$ epitaxial layer 3, to reach the n epitaxial layer 2. Gate electrode 6 formed from polycrystalline silicon is embedded through a 0.1 μm-thickness gate oxide film 5 within each of the trenches 12. Further, a source electrode 8 made of an Al—Si alloy is formed on the surface of the n source region 4, and a drain electrode 9 made of an Al—Si alloy is formed on the rear surface of the n$^+$ substrate 1. As shown in FIG. 1, the source electrode 8 extends over the gate electrode 6 through an insulating film 7.

In operation of the ACCUFET as described above, when a voltage is applied between the drain electrode 9 and the source electrode 8, and the gate electrode 6 is positively biased, an accumulation layer appears at a portion of the n$^-$ epitaxial layer 3 along the gate electrode 6, and electrons flow from the n source region 4 into the n$^-$ epitaxial layer 3 through the accumulation layer. Then, the electrons reach the n$^+$ substrate 1 due to an electric field, and the source electrode 8 and the drain electrode 9 are electrically connected to each other. If the gate electrode 6 is negatively biased, on the other hand, the accumulation layer disappears, and a depletion layer spreads out, whereby the drain electrode 9 and source electrode 8 are disconnected from each other. In this semiconductor device, the n epitaxial layer 2 disposed below the gate oxide film 5 carries (bears or withstands) a part of the voltage applied between the source and drain electrodes 8, 9, thereby lowering a voltage to be carried by the gate oxide film 5, which results in an improved withstand voltage of the device. Further, the present semiconductor device has the same advantages as described above with respect to the conventional ACCUFET. That is, this device uses the accumulation layer to form a channel, instead of the inversion layer, and therefore the mobility of carriers at the channel can be increased, and the channel resistance can be thus reduced. Further, this device is advantageously free from an effect of a parasitic diode, since there is no pn junction in the current path.

Figure 3:
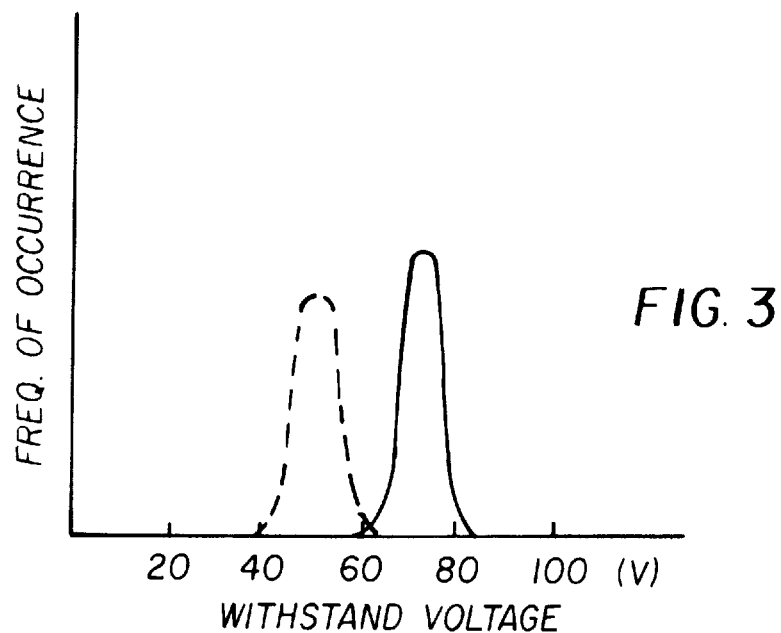
FIG. 3 is a graph representing a withhold voltage distribution of the ACCUFET of the first embodiment, as compared with that of a conventional ACCUFET.
Figure 7:
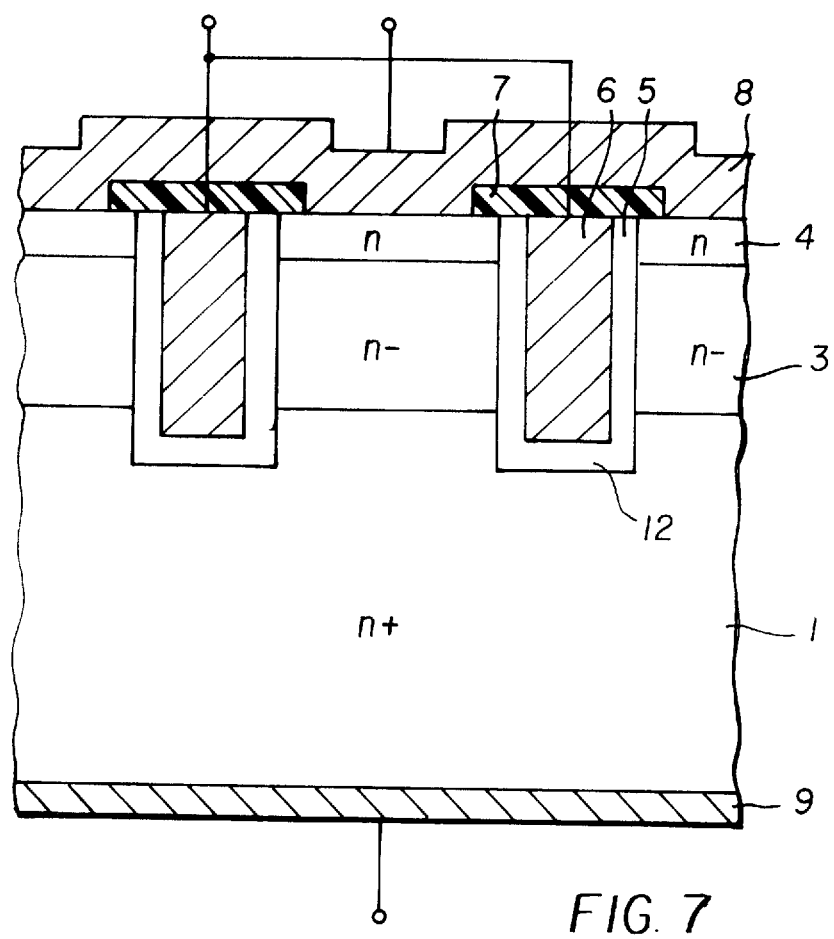
FIG. 7 is a cross sectional view showing a conventional semiconductor device called ACCUFET.

The graph of FIG. 3 shows the withstand voltage distribution of the ACCUFET of the first embodiment as shown in FIG. 1. In FIG. 3, the axis of abscissas indicates the withstand voltage, and the axis of ordinates indicates the frequency of occurrence. For comparison, the withstand voltage distribution of the conventional ACCUFET as shown in FIG. 7 is shown by the dotted line. It will be understood from FIG. 3 that the withstand voltage of the ACCUFET of FIG. 1 is raised 40% on the average, as compared with that of FIG. 7. In the conventional ACCUFET, the bottom part of the trench reaches the n$^+$ substrate having a high impurity concentration, and therefore the depletion layer does not expand (spread out), and a strong electric field is applied to the oxide film located at the bottom of the trench, in particular, corner portions of the oxide film. In the ACCUFET of the first embodiment as shown in FIG. 1, the depletion layer spreads downwards, and the voltage to be carried by the oxide film at the bottom of the trench is reduced, whereby the overall withstand voltage of the device is improved.

The semiconductor device of FIG. 1 is manufactured by the following method. Initially, the n epitaxial layer 2 doped with phosphorous and the n$^-$ epitaxial layer 3 doped with phosphorous were sequentially deposited on the n$^+$ substrate 1 doped with arsenic and having a specific resistance of 0.002 cm, so as to prepare a double epitaxial wafer. The n epitaxial layer 2 has an impurity concentration of $5\times10^{15}$ cm$^{-3}$, and a thickness of 6.0 μm, and the n$^-$ epitaxial layer 3 has an impurity concentration of $1\times10^{14}$ cm$^{-3}$, and a thickness of 4.7 μm. In the meantime, an initial oxide film is formed at a peripheral portion (not shown) of the device, and then the surface layer or region of the epitaxial wafer is subjected to ion implantation and heat treatment, with the dose of $1.3\times10^{15}$ cm$^{-2}$ of arsenic ion to form the n source region 4. The n source region 4 and the n$^-$ epitaxial layer 3 are then etched, using a mask consisting of a photo resist applied by coating, and a silicon oxide film patterned as desired, so as to form the trenches 12 each having a width of 1.8 μm and a thickness of 5.5 μm. In the next step, a 0.1 μm-thickness gate oxide film 5 is formed by thermal oxidation on the inner surface of each trench 12, and then polycrystalline silicon is deposited in the trench 12 by a vacuum CVD method. The polycrystalline silicon located outside of the trench is then removed to form the gate electrode 6. In the next step, the insulating film 7 for separating the gate electrode 6 from the source electrode 8 is formed, and contact holes are formed through portions of the film 7 which are not aligned with the trenches 12. An Al—Si alloy is then vapor-deposited and patterned so as to form the source electrode 8. Further, an Al—Si alloy is deposited on the rear surface of the epitaxial wafer, to form the drain electrode 9.

Figure 2:
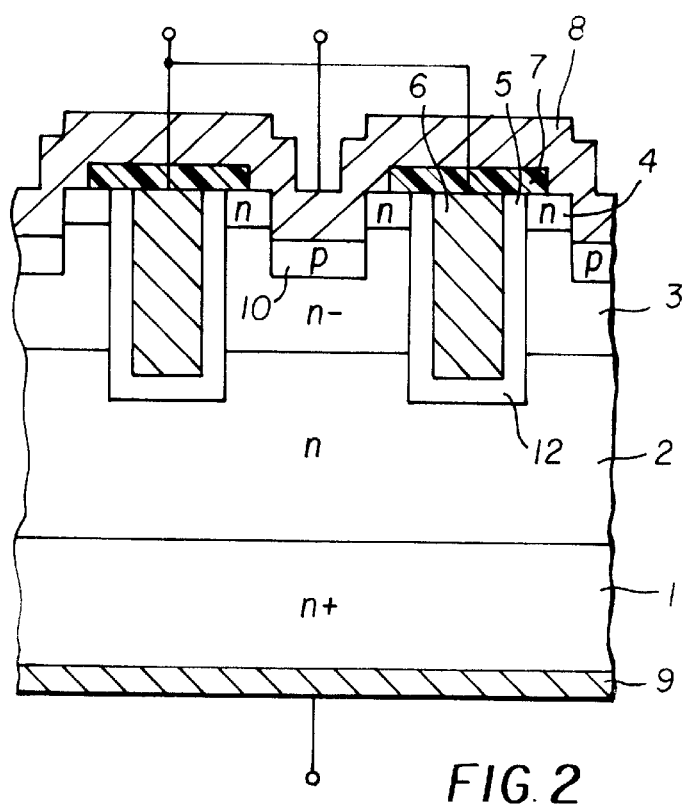
FIG. 2 is a cross sectional view showing a principal part of an ACCUFET according to the second embodiment of the present invention.

FIG. 2 is a cross sectional view showing a principal part of an ACCUFET according to the second embodiment of the present invention. This device is different from that of the first embodiment in that p regions 10 are formed in the surface layer of the n$^-$ epitaxial layer 3 such that the p regions 10 are positioned at the lower level with respect to the n source regions 4, and such that the source electrode 8 is in contact with the surface of the p regions 10. In the device thus constructed, a depletion layer spreading from one trench (gate electrode) more easily reaches another depletion layer spreading from the adjacent trench, due to the presence of the p region 10 therebetween, whereby the channel region can be completely depleted, resulting in a reduced leak current. While the surfaces of the p regions 10 are located lower than those of the n source regions 4 in the device of FIG. 2, the p regions 10 are not necessarily lowered, but may be at the same level with the n source regions 4. The lower position of the p regions 10 is advantageous in terms of a reduced treating time required for forming the p regions 10 by diffusion heat treatment.

Figure 4:
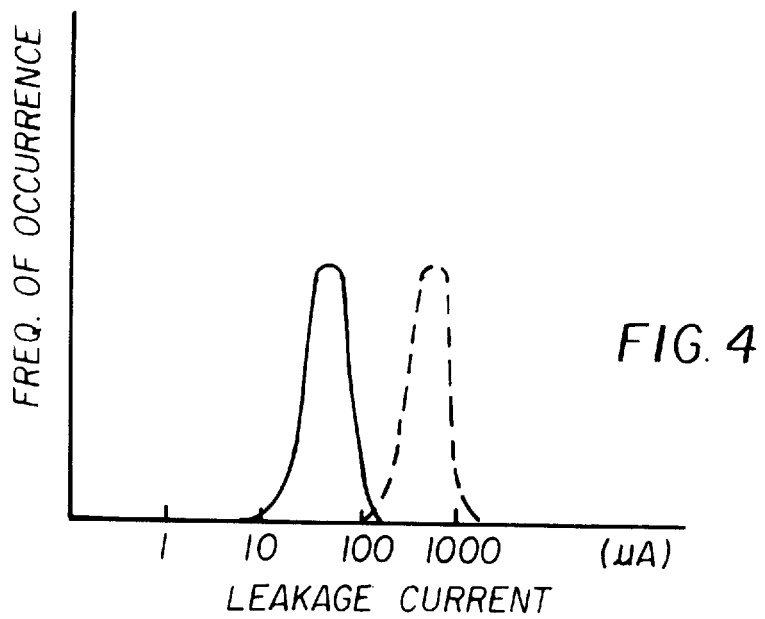
FIG. 4 is a graph representing a leak current distribution of the ACCUFET of the second embodiment, as compared with that of a conventional ACCUFET.
Figure 5:
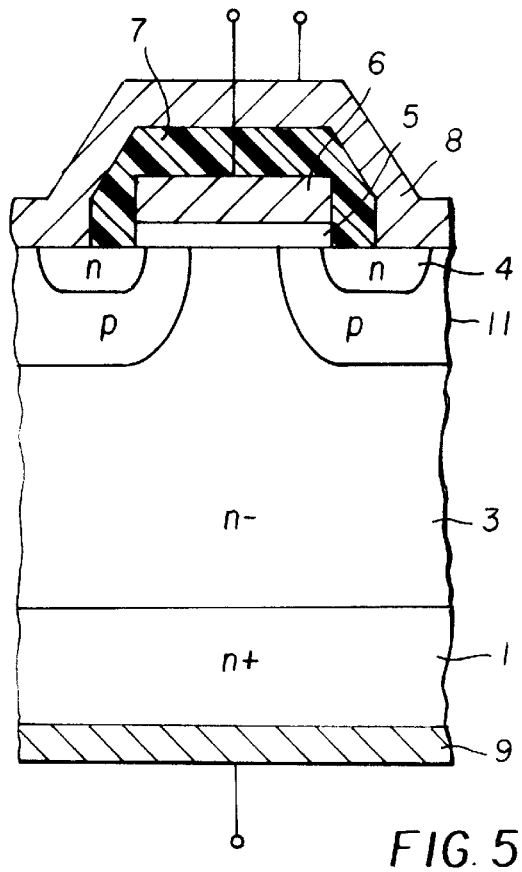
FIG. 5 is a cross sectional view showing a conventional semiconductor device called DMOSFET.
Figure 6:
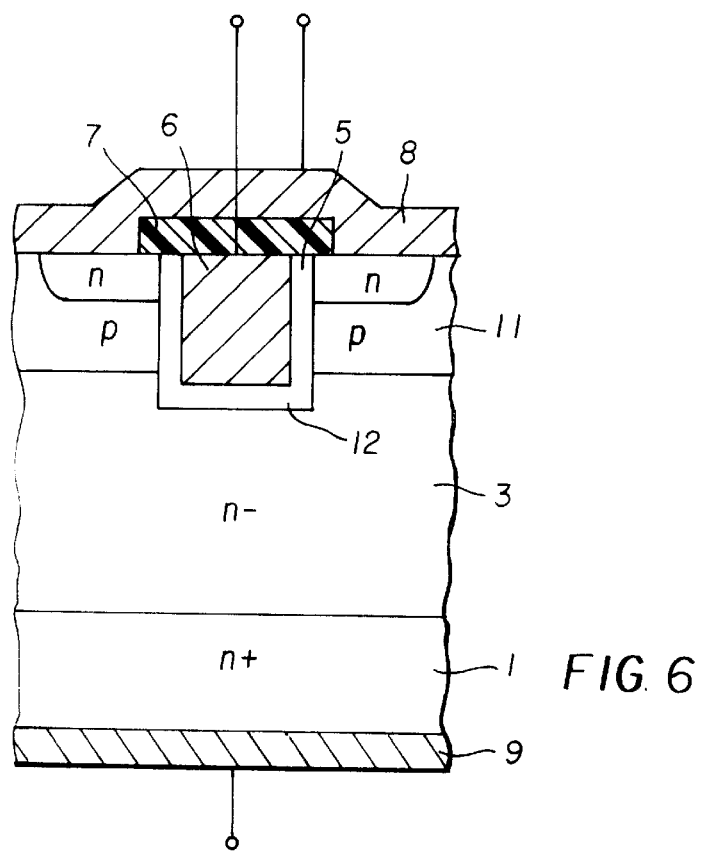
FIG. 6 is a cross sectional view showing a conventional semiconductor device called UMOSFET.

The graph of FIG. 4 shows the leak current distribution of the ACCUFET of the second embodiment as shown in FIG. 2. In FIG. 4, the axis of abscissa indicates the leakage current, and the axis of ordinate indicates the frequency of occurrence. For comparison, the leakage current distribution of the conventional ACCUFET is also shown by a dotted line. It will be understood from FIG. 4 that the leakage current is reduced to about one tenth.

As described above, the accumulation type field-effect transistor according to the present invention is constructed such that the high-concentration substrate of the first conductive type and the low-concentration layer of the first conductive type interpose therebetween the semiconductor layer of the first conductive type, whose impurity concentration is between those of the high-concentration substrate and the low-concentration layer. In this arrangement, a voltage to be carried by the gate oxide film within the trench can be reduced, assuring an improved withstand voltage of the device. If another region of the second conductive type is formed in a portion of the surface layer of the second semiconductor layer between the adjacent two trenches, the second semiconductor layer can be more completely depleted upon application of a voltage thereto, resulting in a reduced leakage current.

What is claimed is:

1. A vertical semiconductor device comprising:

a layered semiconductor structure including a semiconductor substrate of a first conductive type having a first impurity concentration, a first semiconductor layer of the first conductive type formed on the semiconductor substrate and having a second impurity concentration lower than the first impurity concentration, and a second semiconductor layer of the first conductive type formed on the first semiconductor layer and having a third impurity concentration lower than the second impurity concentration;

a source region of the first conductive type formed in a surface region of said second semiconductor layer;

at least one gate electrode extending from a front surface of said layered semiconductor structure through said second semiconductor layer to reach said first semiconductor layer;

a gate oxide film located between said gate electrode and said first and second semiconductor layers;

an insulating film formed on said gate electrode at said front surface of said layered semiconductor structure;

a source electrode formed on said source region of the first conductive type;

a drain electrode formed on said semiconductor substrate of the first conductive type at a rear surface of said layered semiconductor structure; and a region of a second conductive type formed in a portion of said surface region of said second semiconductor layer between two adjacent gate electrodes at a lower level with respect to the source region, such that the region of second conductive type is separated from the two adjacent gate electrodes by said second semiconductor layer, and wherein the source electrode is in contact with a surface of the region of second conductive type.

\* \* \* \* \*